US006472879B2

(12) United States Patent
Park

(10) Patent No.: US 6,472,879 B2
(45) Date of Patent: Oct. 29, 2002

(54) METHOD FOR DIAGNOSING A BATTERY OF A VEHICLE AND A SYSTEM THEREOF

(75) Inventor: Sun-Soon Park, Suwon (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 10/012,499

(22) Filed: Dec. 12, 2001

(65) Prior Publication Data

US 2002/0084785 A1 Jul. 4, 2002

(30) Foreign Application Priority Data

Dec. 28, 2000 (KR) .............................. 00-84034

(51) Int. Cl.⁷ ............................................. G01N 27/416
(52) U.S. Cl. ....................................... 324/426; 324/433
(58) Field of Search ................................. 320/127, 128, 320/134, 136; 324/426, 429, 430, 433

(56) References Cited

U.S. PATENT DOCUMENTS 4,379,990 A * 4/1983 Sievers et al.
6,072,300 A * 6/2000 Tsuji

* cited by examiner

Primary Examiner—Edward H. Tso
(74) Attorney, Agent, or Firm—Antonelli, Terry, Stout & Kraus, LLP

(57) ABSTRACT

When charging of a battery is started, a voltage of each module being charged is detected, and then an average voltage and at least one of a maximum voltage and a minimum voltage of the modules are calculated. Subsequently, if an absolute value of a difference between the average voltage and at least one of the maximum and the minimum voltages is greater than a predetermined reference value, it is determined that the battery may be malfunctioning. If it is determined that the battery may be malfunctioning, a charging mode is changed to a safer mode and a warning of the possible malfunction is given.

5 Claims, 5 Drawing Sheets

METHOD FOR DIAGNOSING A BATTERY OF A VEHICLE AND A SYSTEM THEREOF

CROSS-REFERENCE TO RELATED APPLICATION

This application claims priority of Korea patent Application No. 2000-84034, filed on Dec. 28, 2000.

BACKGROUND OF THE INVENTION (a) Field of the Invention

The present invention relates to a method for diagnosing a battery of a vehicle and a system thereof, and more particularly to a method for diagnosing a battery of a vehicle to detect deterioration of a battery of a vehicle earlier and more precisely and a system thereof.

(b) Description of the Related Art

An internal combustion engine, such as a gasoline engine used for a power source of a vehicle, transforms heat energy generated in combustion into dynamic energy to be used as a driving power for a vehicle.

But the exhaust gas generated during combustion includes various noxious gases such as nitrogen oxide, and carbon monoxide and hydrocarbons are produced by incomplete combustion such that these gases become a principal cause of air pollution.

Especially in these days when the number of automotive vehicles has increased explosively, air pollution caused by the exhaust gas of vehicles has become a principal social issue.

Therefore, vehicles that do not exhaust such noxious gases and that do not use limited natural resources, such as electric vehicles and solar powered vehicles that utilize solar energy as a power source, have been discussed, and research and development for such vehicles has greatly progressed to a point where such vehicles are close to being put into practical use.

An electric vehicle includes a battery of which the charged energy is used as a power source; a motor that generates driving force of a vehicle, the motor being operated by the charged energy of the battery; and a controlling apparatus to control the battery and the motor.

In addition, a solar powered vehicle includes solar cells that generate electric energy from solar energy, a battery to store the electric energy, a motor to drive the vehicle, and a controller for controlling the above-mentioned parts. A solar powered vehicle is different from an electric vehicle in that it includes solar cells to transform solar energy to electric energy and therefore charge the battery.

Solar powered vehicles are under continuing research and development so that they may be put to practical use because they attract considerable attention for their pollution-free characteristics. Functioning and performance of the above-mentioned parts of solar powered vehicles are required to be precisely monitored.

A battery of a vehicle is an important power reservoir and source, especially when the vehicle is an electric vehicle or a solar powered vehicle. Therefore, the current charging and/or charge state of the battery has to be checked and determined to prevent possible malfunction caused by excessive discharging of the battery, and to prevent the possibility of accidents that may occur when the battery is in an abnormal state.

A conventional battery for an electric or a solar powered vehicle includes a plurality of modules, where each module includes a number of cells. For example, each module includes ten (10) cells, where each cell stores 1.2 volts when charged, and twenty-six (26) modules are included in the battery so that the potential output voltage of the battery is over 300 volts.

According to the prior art, in order to determine whether a battery is malfunctioning, an absolute value of the difference between a maximum voltage and a minimum voltage of included modules is measured and compared with a predetermined reference voltage difference (for example, 1V), and the battery is determined to be malfunctioning if the absolute value is greater than the predetermined reference voltage difference, which is a condition for changing the charging mode.

FIGS. 1a and 1b shows examples of voltage distribution measured according to the prior art.

The dotted line in the lower graph of FIG. 1 is a normal distribution curve fitted to the module voltage distribution.

FIG. 1a shows the voltage distribution of modules uniformly spread in a region of $\Delta V$, in which case there is no problem in determining malfunctioning of a battery.

However, FIG. 1b shows the voltage distribution of modules where all are concentrated around an average value except one. In such a case as shown in FIG. 1b, the module of which the voltage is far from the average value is probably malfunctioning or is deteriorated, but according to the prior art, the malfunctioning/deterioration cannot be detected if the difference between the maximum and the minimum value of voltages is less than a predetermined reference voltage difference. Therefore, the deteriorated module suffers damage for a long time until the deterioration is detected, and thereby the whole battery can deteriorate so much that it cannot work to drive a vehicle.

According to the prior art, if the voltages of the modules do not satisfy the condition for changing charging mode, the charging is not stopped even when the battery malfunctions, and therefore pressure and temperature increase in the malfunctioning cell because the malfunctioning cell will have high resistance, and furthermore, a fire may possibly be caused because of the heat.

SUMMARY OF THE INVENTION

Therefore, the present invention has been made in an effort to improve accuracy of determining whether a battery of a vehicle malfunctions or is deteriorated.

It is an objective of the present invention to provide a method to monitor battery function with more accuracy, and to determine if the battery may be malfunctioning and which module may be malfunctioning.

To achieve the above objective this invention provides a method for diagnosing a battery of a vehicle, the battery including a plurality of modules, the method comprising:

starting charging of a battery; detecting voltage of each module being charged; calculating an average voltage and at least one of a maximum voltage and a minimum voltage of the modules; calculating an absolute value of a difference between the average voltage and at least one of the maximum and the minimum voltages; and determining whether the battery may be malfunctioning by comparing the absolute value with a predetermined reference value.

The method for diagnosing the battery is performed by a system for diagnosing a battery of a vehicle of the present invention, the system comprising:

a battery charging part;

a charging control part for controlling the battery charging part in order to charge the battery to a predetermined voltage;

a battery voltage detecting part for detecting voltages of the modules of the battery; and a display part for displaying a current state of the battery: wherein the charging control part, after the receiving module voltages from the battery voltage detecting part, calculates an average voltage and at least one of a maximum and the minimum voltage of the modules, and an absolute value of a difference between the average voltage and at least one of the maximum and the minimum voltages, and then determines whether the battery may be malfunctioning by comparing the absolute value with a predetermined reference value.

If it is determined that the battery may be malfunctioning, the charging control part changes a charging mode or warns of the possibility of malfunction by activating the display part.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

A preferred embodiment of the present invention will be described hereinafter with reference to the accompanying drawings.

Figure 1A:
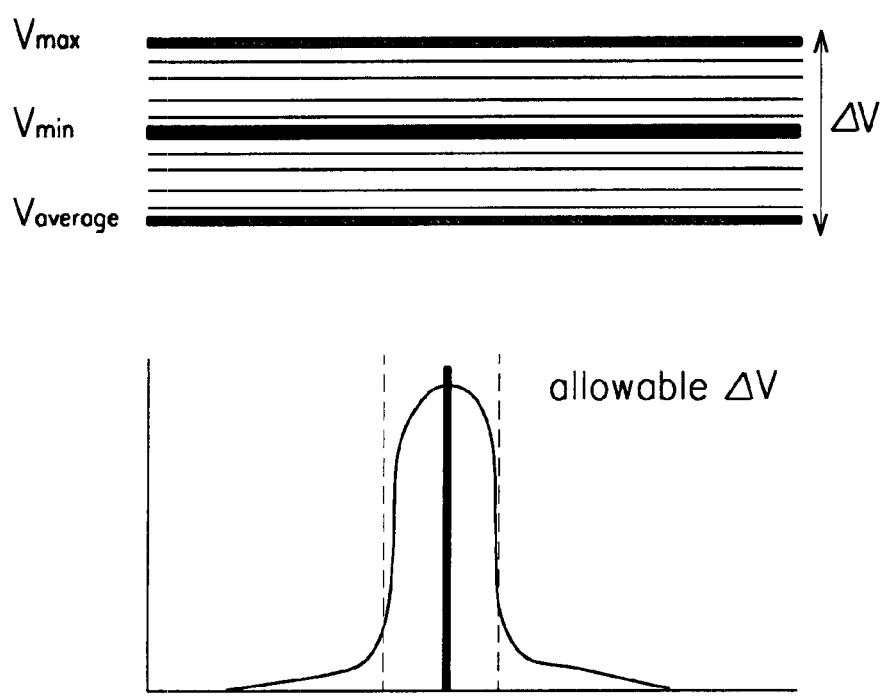
FIGS. 1a and 1b shows examples of voltage distribution of battery modules measured according to the prior art.
Figure 1B:
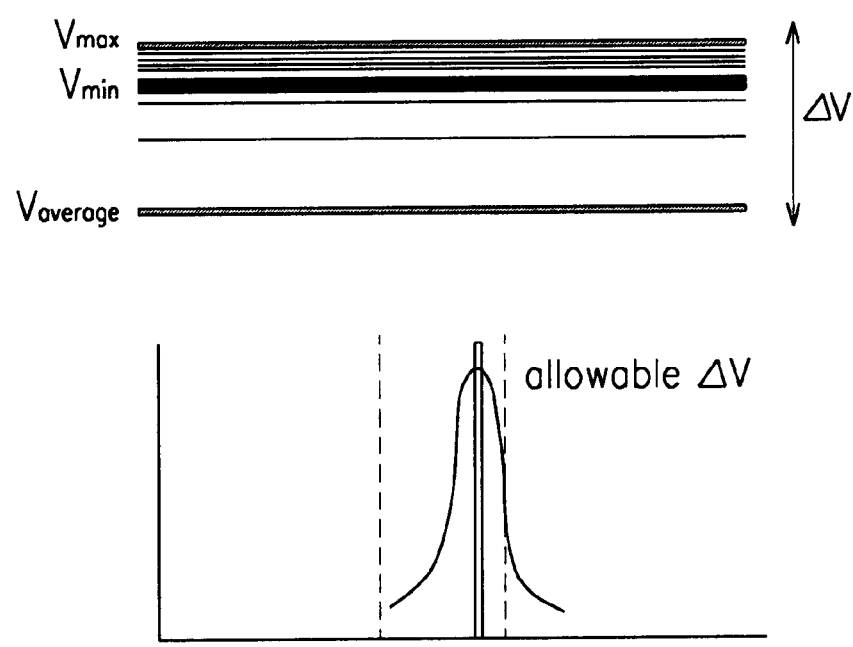
Figure 2:
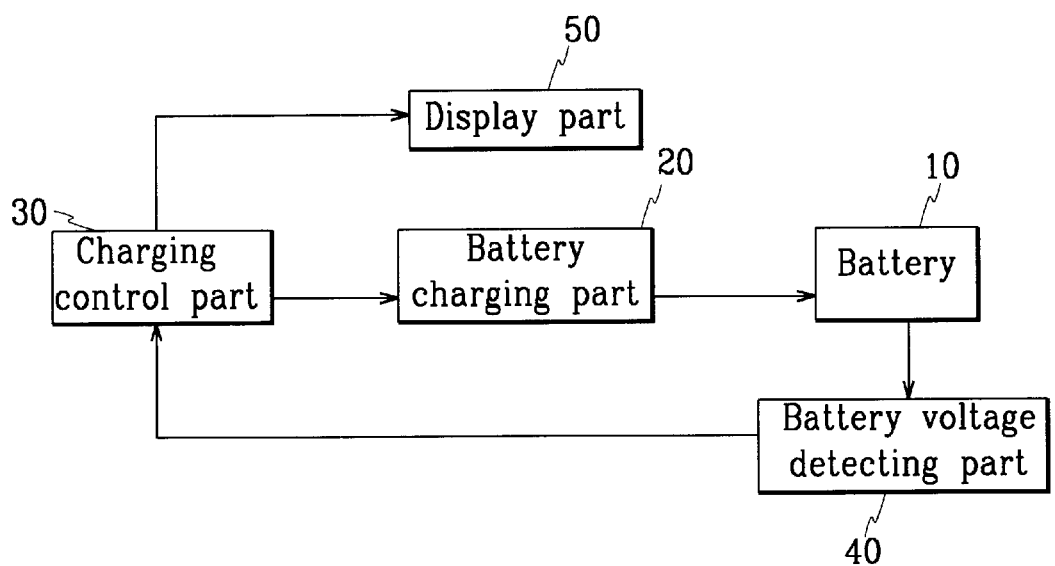
FIG. 2 is a block diagram of a system for diagnosing a battery according to a preferred embodiment of the present invention.

FIG. 2 shows a block diagram of a system for diagnosing a battery according to a preferred embodiment of the present invention.

The system for diagnosing the battery 10 includes a battery charging part 20, a charging control part 30 for controlling the battery charging part 20 in order to charge the battery 10 to a predetermined voltage, a battery voltage detecting part 40 for detecting the module voltages of the battery 10, and a display part 50 for displaying a current state of the battery 10.

The charging control part 30 diagnoses the battery 10 on the basis of the detected voltages and warns of the possibility of malfunctioning by activating the display part 50.

The display part 50 may include a visual apparatus such as a liquid crystal display (LCD) device and light emitting diode (LED), and may include a buzzer or speaker for making a sound to notify of the results of diagnosis.

The battery 10 includes a plurality of modules, where each module includes a plurality of cells. For example, each module includes ten (10) cells, where each cell stores 1.2 volts when charged, and twenty-six (26) modules are included in the battery so that the potential output voltage of the battery is over 300 volts.

A preferred embodiment of a method for diagnosing a battery according to the present invention is hereinafter described in detail. The preferred embodiment of the present invention is a method for detecting deterioration in functioning of each module included in a battery so as to make it possible to detect possible malfunctioning of the battery early and precisely.

When a battery deteriorates, the deterioration does not usually occur to all the modules at the same time and at the same deterioration level, and it is almost impossible to detect the specific cell that has deteriorated.

However, modules have a tendency to have similar voltages because they include a plurality of cells. Therefore, if there is a module whose voltage is much different from an average voltage of all the modules, the module can be regarded as having a great possibility of starting to malfunction.

Figure 3:
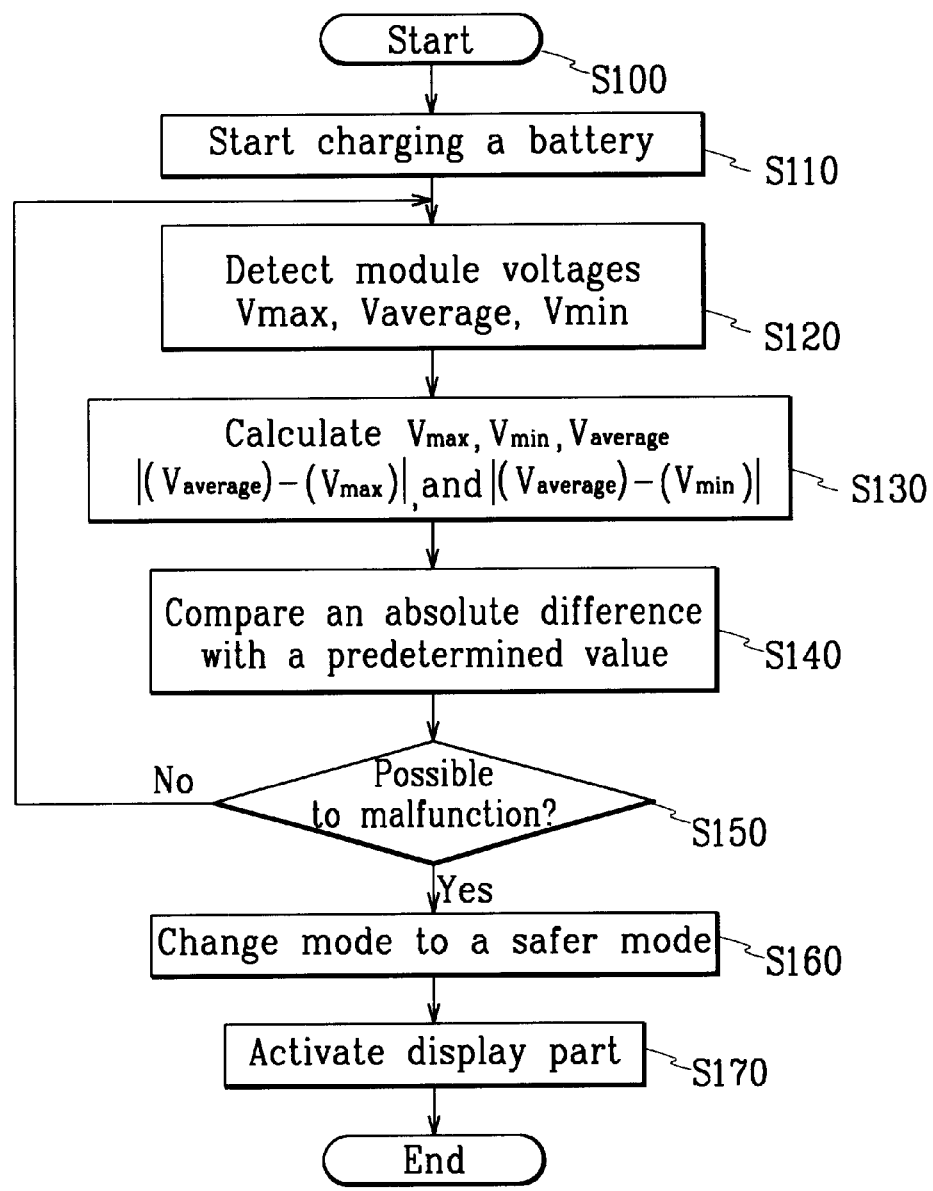
FIG. 3 is a flowchart showing a method for diagnosing a battery according to a preferred embodiment of the present invention.

FIG. 3 is a flowchart showing a method for detecting deterioration of a battery according to a preferred embodiment of the present invention.

When the method of the preferred embodiment of the present invention is started at step S100, the charging control part 30 activates the battery charging part 20 at step S110 in order to charge the battery 10 to a predetermined voltage.

Figure 4:
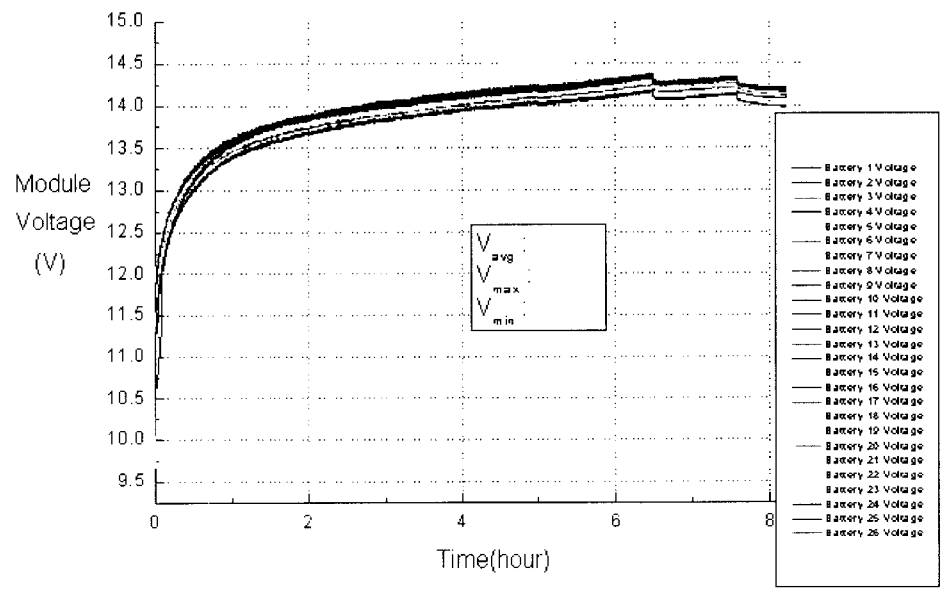
FIG. 4 is a graph showing a voltage characteristic of a normal battery while being charged, according to a preferred embodiment of the present invention.

FIG. 4 shows a graph showing voltage characteristics of a normal battery while being charged, according to a preferred embodiment of the present invention. Module voltages in the battery 10 are concentrated around their average value as shown in FIG. 4, if the battery 10 is not deteriorated.

After charging of the battery 10 is started at step S110, the charging control part 30 starts checking the current state of the battery on the basis of the module voltages detected from the battery voltage detecting part 40 (steps S120 through S140).

More particularly, the battery voltage detecting part 40 detects each module voltage $V_{module}$ and transmits the detected module voltage signals to the charging control part 30 at step S120, and accordingly the charging control part 30 calculates the maximum voltage $V_{max}$, the minimum voltage $V_{min}$, and the average voltage $V_{average}$ of the module voltages at step S130.

At step S130, the charging control part 30 further calculates an absolute value of the difference between the average voltage and the maximum voltage $|(V_{average})-(V_{max})|$ and an absolute value of the difference between the average voltage and the minimum voltage $|(V_{average})-(V_{min})|$.

Subsequently, the charging control part 30 compares each of the calculated absolute values with a predetermined value $V_{reference}$ at step S140, and then at step S150 it determines whether a possibility exists of malfunction according to the results of comparison of step S140.

Figure 5:
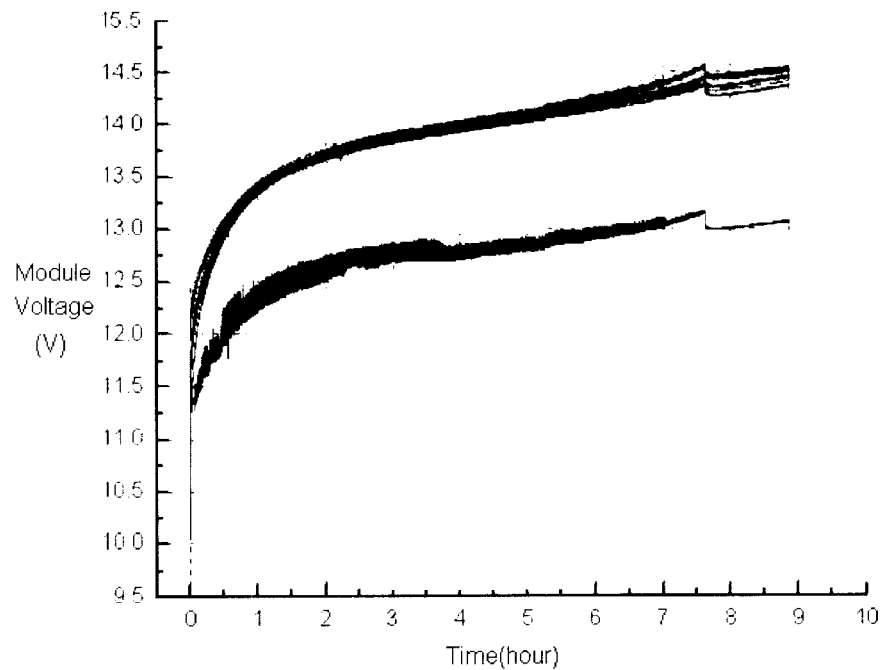
FIG. 5 is a graph showing a voltage characteristic of a battery when a module is malfunctioning, according to a preferred embodiment of the present invention.

FIG. 5 is a graph showing voltage characteristics of a battery when a module is malfunctioning.

If a cell in a module is malfunctioning such that it does not form any voltage, the voltage of the malfunctioning module is less than other module voltages by about 1.2 volts when fully charged, as shown in FIG. 5.

Therefore, if one of the absolute values of the voltage differences $|(V_{average})-(V_{max})|$ and $|(V_{average})-(V_{min})|$ is greater than the predetermined reference value $V_{reference}$, the module that shows an excessive deviation from the average voltage can be determined to have a possibility of a malfunction at step S150. For the comparison, the predetermined reference value $V_{reference}$ is predetermined to be lower than a cell voltage, and more preferably, to be a function of the average voltage.

If it is determined that a module may be malfunctioning at step S150, the charging control part 30 changes the charging mode to a safer charging mode at step S160. For example, the charging mode is changed to a normal charging mode at step S160 if the current charging mode is a rapid charging mode. The safer charging mode may be predetermined to be a mode in which the charging current is limited or to be a mode in which the charging voltage is limited.

Furthermore, if it is determined that a module may be malfunctioning at step S150, the charging control part 30 activates the display part 40 at step S170 in order to warn of the possibility of a malfunction of the battery 10 so that the vehicle may have appropriate maintenance.

As described above, according to the preferred embodiment of the present invention, when the battery is determined to have a possibility of a malfunction, the charging mode is changed to a safer mode, for example, to a normal charging mode if the current charging mode is a rapid charging mode, so that an abrupt malfunction of the battery is prevented, the lifecycle of the battery is maintained, and appropriate maintenance is enabled by warning through a display part.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for diagnosing a battery of a vehicle, the battery including a plurality of modules, the method comprising:

starting charging of the battery;

detecting voltage of each module being charged;

calculating an average voltage and at least one of a maximum voltage and a minimum voltage of the modules;

calculating an absolute value of a difference between the average voltage and at least one of the maximum and the minimum voltages; and determining whether the battery may be malfunctioning by comparing the absolute value with a predetermined reference value.

2. The method of claim 1, further comprising:

changing a charging mode to a predetermined safer mode if it is determined that the battery may be malfunctioning.

3. The method of claim 1, further comprising:

warning of the possibility of a malfunction of the battery if it is determined that the battery may be malfunctioning.

4. A system for diagnosing a battery of a vehicle, the battery including a plurality of modules, the system comprising:

a battery charging part;

a charging control part for controlling the battery charging part in order to charge the battery to a predetermined voltage;

a battery voltage detecting part for detecting voltages of the modules of the battery; and a display part for displaying a current state of the battery;

wherein the charging control part, after receiving the module voltages from the battery voltage detecting part, calculates an average voltage and at least one of a maximum and a minimum voltage of the modules, and an absolute value of a difference between the average voltage and at least one of the maximum and the minimum voltages, and then determines whether the battery may be malfunctioning by comparing the absolute value with a predetermined reference value.

5. The system of claim 4 wherein the charging control part changes a charging mode to a predetermined safer mode if it is determined that the battery may be malfunctioning.

* * * * *